United States Patent [19]

Graham et al.

[11] Patent Number: 4,872,140

[45] Date of Patent: Oct. 3, 1989

[54] LASER PROGRAMMABLE MEMORY ARRAY

[75] Inventors: Andrew C. Graham; David C. MacMillan, both of Sunnyvale, Calif.

[73] Assignee: Gazelle Microcircuits, Inc., Santa Clara, Calif.

[21] Appl. No.: 51,971

[22] Filed: May 19, 1987

[51] Int. Cl.$^4$ .............................................. G11C 17/00
[52] U.S. Cl. .................................. 365/96; 365/225.7
[58] Field of Search ................... 365/94, 96, 104, 105, 365/225.7

[56] References Cited

U.S. PATENT DOCUMENTS

| | | | |
|---|---|---|---|
| 3,656,115 | 4/1972 | Foerster | 340/825.84 |
| 3,740,523 | 6/1973 | Cohen et al. | 219/121 LJ |
| 4,130,889 | 12/1978 | Chua | 365/96 |
| 4,238,839 | 12/1980 | Redfern et al. | 365/96 |
| 4,517,583 | 5/1985 | Uchida | 357/41 |
| 4,628,590 | 12/1986 | Udo et al. | 29/575 |
| 4,689,657 | 8/1987 | Percival et al. | 357/68 |

FOREIGN PATENT DOCUMENTS 0083211 12/1982 European Pat. Off. .

OTHER PUBLICATIONS

Conrad J. Bolsvert, "One Day Laser Programmed Gate Arrays", *Laserpath Application Note*, Jun. 1986, pp. VII-1 to VII-6.

R. Smith et al., "Laser Programmable Redundancy and Yield Improvement in a 64K DRAM", *IEEE Journal of Solid-State Circuits*, vol. SC-16, No. 5, Oct. 1981.

J. North & W. Weick, "Laser Coding of Bipolar Read-Only Memories", *IEEE Journal of Solid-State Circuits*, vol. SC-11, No. 4, Aug. 1976.

Primary Examiner—Joseph A. Popek
Attorney, Agent, or Firm—Skjerven, Morrill, MacPherson, Franklin & Friel

[57] ABSTRACT

This invention discloses a laser programmable read only semiconductor-based memory array comprised of memory cells, a group of word lines, a group of bit lines. Each of the memory cells is connected to one of the group of bit lines, and one of the group of word lines and each memory cell is comprised of a memory element and a laser programmable link. In one embodiment, each memory cell is comprised of a transistor and a laser programmable link composed of the same material as either the word or the bit lines. Programming is accomplished by laser coding of the links.

6 Claims, 3 Drawing Sheets

LASER PROGRAMMABLE MEMORY ARRAY

BACKGROUND OF THE INVENTION

1. Field of the Invention

This invention relates generally to semiconductor-based programmable memory arrays. Specifically, it relates to programmable memory arrays using laser programmable links.

2. Prior Art

Programmable read only memory (PROM), programmable logic arrays (PLA), and other forms of programmable logic devices (PLD) are available in many different forms, but all such arrays are based upon silicon semiconductor technology. While compound semiconductor-based (i.e., for example, gallium arsenide-based) integrated circuits have taken longer to develop, gallium arsenide (GaAs) based logic and memory integrated circuits are commercially available. However, limitations of compound semiconductor technology have prevented the development of semiconductor PROMs, PLAs and PLDs in that technology even though the performance of such devices would be significantly enhanced by its use.

To better understand the limitations of using the silicon-based PROM and PLA technology, consider a typical field programmable silicon memory array as shown in FIG. 1. There are N parallel word lines 10 arranged in rows and M parallel bit lines 11 orthogonal to the word lines. A fuse 12 and diode 13 in series connect each intersection of a word and a bit line, while a resistive load 14 typically connects one end of each bit line to ground. To program the array means are provided to select a desired word line and a desired bit line, and then a current sufficient to blow the fuse connecting the two lines is passed through the fuse-diode combination. The programmer can configure the array in any desired fashion by eliminating the interconnections between the bit and word lines. Many compound semiconductor-based devices and even some silicon-based devices cannot support the current or voltage necessary to blow the fuse. Hence, a PROM, a PLA or a PLD based upon electrically blown fuses can be implemented with present technology effectively in only a narrow group of silicon semiconductors. Further, even in the group of silicon-based semiconductor devices which can support the voltage and current necessary to blow the fuse, when the array size becomes large the loss of voltage and current in the programming conductive path can cause inadequate programming in some portions of the array circuit.

The electrically blown fuse fabrication of a silicon-based device requires multiple steps which must be carefully controlled. As shown in FIG. 2a, first the fuse material 27 is deposited on the substrate 26. The thickness of the fuse material must be carefully controlled to assure proper operation in the programming mode. Next, a metallization layer 28 is deposited over the fuse material and then the metallization layer is etched away to expose the fuse as shown in FIG. 2b. Each of these steps must be carefully performed or the fuse connection will not function correctly during the programming operation.

A field programmable silicon-based PLA or PROM, as in FIG. 1, gives the programmer flexibility in obtaining a desired circuit, but the performance of such a device is compromised because large voltage and current is required to program the array, and the programming circuit often represents a significant portion of the entire memory chip thereby dissipating more power and consuming large chip area. The components comprising the programmable array, which are fabricated to withstand the large programming voltage, perform slower than components which are not fabricated to withstand such voltages Hence, the speed of a field programmable silicon-based PLA or PROM is degraded by the requirement that the device withstand the large programming voltage. The requirement that the circuit withstand a large voltage also constrains the circuit design Furthermore, the layout of a circuit which must withstand high voltages is larger than that of a circuit which does not need to withstand large voltages. The larger layout reduces the speed of the device and decreases the yield.

The programming circuit for a PLA or PROM not only represents a significant portion of the entire memory chip, but also the programming circuitry degrades the performance of the device. Although the programming circuitry is not needed after the programming of the chip, it remains connected to the memory array after programming and the programming circuitry acts as an additional load on the array during normal operation. This additional load reduces the performance of the array, specifically the speed of the array.

Several different approaches have been tried to enhance both the performance of silicon-based PROMs and PLAs and the reliability of programming large arrays. For example, Chua, "Programmable Write-Once, Read-Only Semiconductor Memory Array Using SCR Current Sink and Current Sources Devices", U.S. Pat. No. 4,130,889 issued Dec. 19, 1978, adds additional circuitry at the end of each word and bit line in the array to enhance the performance of the array. While this invention may make large arrays feasible and while it may increase the reliable performance of a large array, it and the other approaches cannot eliminate the problems in performance introduced by the requirements of a large programming voltage and current.

In the prior art, other approaches have been used to program semiconductor devices. For example, in the desire to provide flexibility to the user of gate arrays, a silicon-based device having various gate arrays interconnected by laser programmable links, i.e. links which may be blown with a laser, has been developed (see Laserpath Applications Note AN-1 dated June 1986 and entitled "One Day Laser Programmed Gate Arrays"). This device is a large silicon-based circuit comprised of transistors which are interconnected with laser programmable links and various groups of these transistors are further interconnected with laser programmable links. To program the circuit, the links connecting the transistors are blown so that the transistors form a desired gate. Then, the programmable links connecting the group of transistors comprising the gate with other groups of transistors comprising other gates are blown to provide the user-specified gate interconnections. The various combinations of transistors to form gates and combinations of gates to form a gate array circuit requires a large number of programmable links and a large circuit.

While the large circuit provides flexibility, the size of the circuit degrades its speed in comparison to the typical gate array circuit. Also, the size of the circuit diminishes the yield per wafer. The flexibility in specifying the gate array circuit also introduces additional problems The fuses are in close proximity to other fuses and components. With the close proximity and the large number of fuses, the probability that a fuse will not be blown properly increases and each circuit, which malfunctions because the fuses have been improperly blown, decreases the yield. Also, errors in programming the fuses cannot be detected until the device is completely programmed and tested to determine whether it performs the proper logical function.

The development of very large scale integrated memory arrays introduced a need for spare rows and columns of memory cells in addition to the primary memory array to assure reasonable yields. R. Smith et al. "Laser Programmable Redundancy and Yield Improvement in a 64K DRAM," *IEEE J. of Solid-State Circuits*, SC-16 No. 5, October, 1981. The spare rows and columns are interconnected to the memory array through laser programmable fusible links. If a defective row is detected in the primary memory array, appropriate fuses are blown to replace the defective row with one of the spare rows. Similarly, one of the spare columns of memory cells may be used to replace a defective column of memory cells in the primary memory array. Here the use of fusible links does not enhance the performance of the array. The redundant memory only enhances the yield of usable memory arrays.

Hence, in the prior art, arrays with fusible links which allow the user to configure the array into a desired circuit are well known. However, in each case the flexibility does not enhance the circuit performance and in most cases the flexibility significantly degrades the circuit performance with respect to speed. Also, with the exception of the DRAMs, the circuits with programmable links decrease the yield available from a wafer in comparison to similar circuits which do not contain such links.

In the prior art, laser programming of a silicon-based read only memory was disclosed by Cohen et al., "Encoding of Read Only Memory By Laser Vaporization", U.S. Pat. No. 3,740,523, issued June 19, 1973 and by J. North and W. Weick, "Laser Coding of Bipolar Read-Only Memories", *IEEE Journal of Solid-State Circuits*, Vol. SC-11, No. 4, August 1976. In both of these disclosures, a read-only memory having a titanium-platinum-gold metallization and titanium platinum laser programmable links was disclosed. The link was formed by successively applying layers of titanium, platinum and gold on the silicon substrate and then etching the gold away in selected areas to form the programmable links Removable of the gold was necessary to avoid damage to the silicon substrate in the vaporization of the link.

Hence, the programmable link was not comprised of the same materials as the word or bit lines, and the link has more resistance than a link comprised of the same material as the word or bit lines. As with the electrically blown links, shown in FIG. 2b, the formation of the titanium-platinum link requires on additional processing step to etch away the metal overlying the link. If the etch step is not performed precisely, the fuse links will not be vaporized during the programming step.

SUMMARY OF THE INVENTION

In accordance with the present invention, the performance problems of implementing a PROM or PLA have been overcome. This invention discloses a laser programmable read only semiconductor-based memory array. The memory array is comprised of memory cells, a group of word lines, a group of bit lines. Each of the memory cells is connected to one of the group of bit lines, and one of the group of word lines and each memory cell is comprised of a memory element and a laser programmable link. In one embodiment, each memory cell is comprised of a transistor and a laser programmable link composed of the same material as either the word or the bit lines. A memory cell has a first electrical state prior to programming the cell and an irreversible different second electrical state after programming. Programming is accomplished by laser coding of the links.

Numerous other advantages and features of the present invention will become readily apparent from the following detailed description of the invention and of one embodiment thereof, from the claims and from the accompanying drawings.

DETAILED DESCRIPTION

Figure 1:
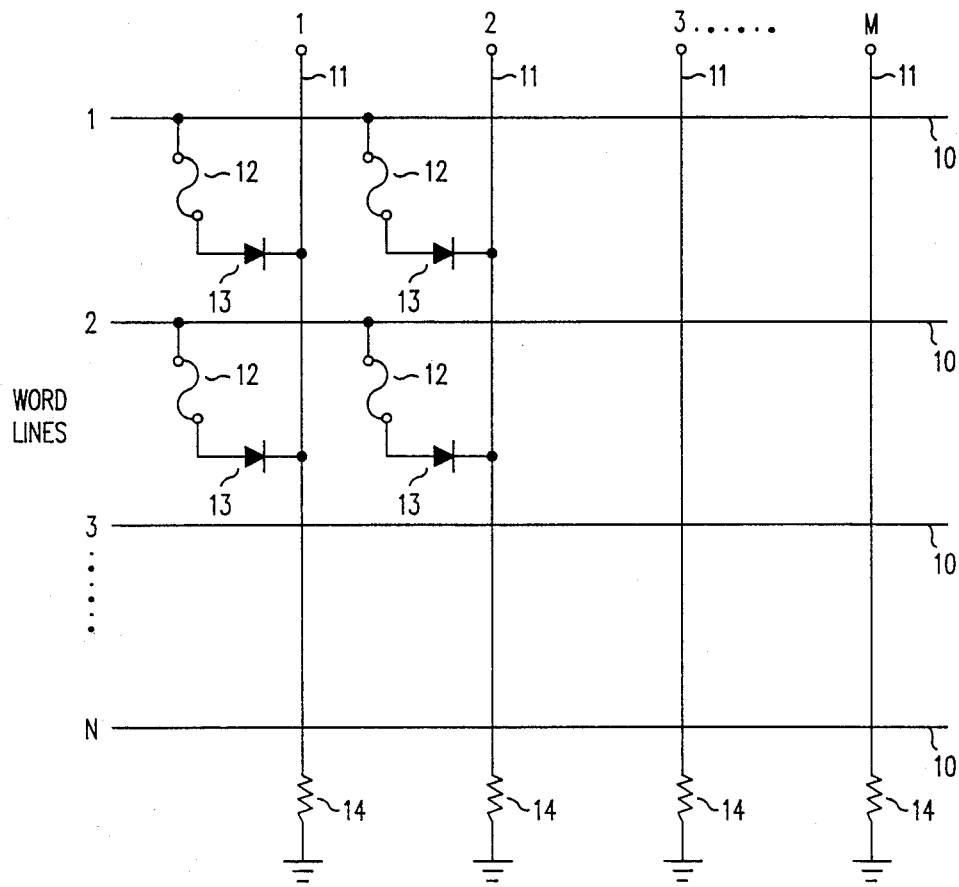
FIG. 1 illustrates a prior art programmable silicon-based memory array.
Figure 2A:
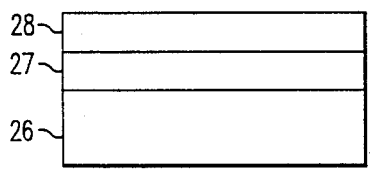
FIG. 2a and 2b illustrate the prior art fuse fabrication.
Figure 2B:
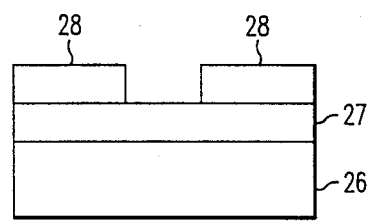

The present invention comprises a programmable array which provides both flexibility in circuit design and high-speed performance. While this invention is susceptible of embodiment in many different forms, there is shown in the drawings and detailed description one specific embodiment, with the understanding that the present disclosure is to be considered as an exemplification of the principles of the invention and is not intended to limit the invention to the embodiment illustrated.

Figure 3:
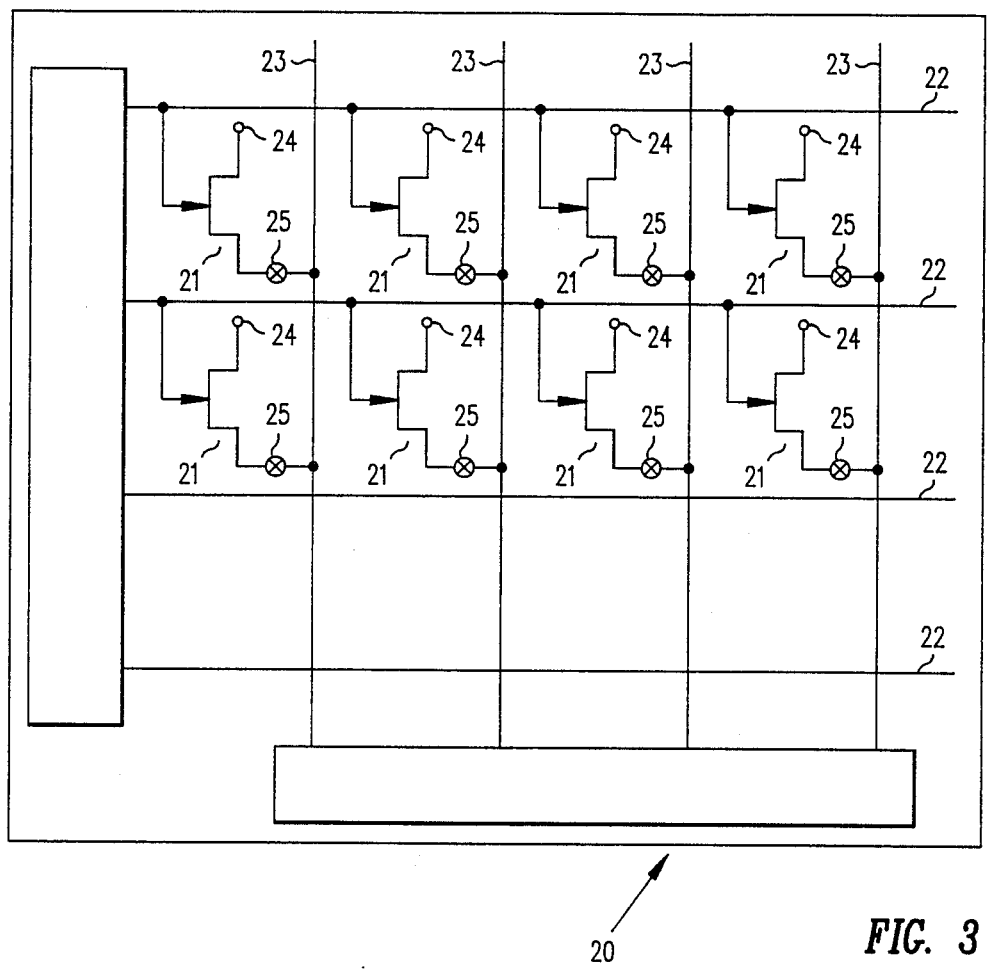
FIG. 3 illustrates the novel compound semiconductor-based programmable memory with a transistor memory cell.

The present invention comprises a programmable array which provides both flexibility in circuit design and high-speed performance. The programmable array in FIG. 3 is not subject to the performance compromises of the prior art programmable arrays. The programmable array is shown as part of a compound semiconductor-based chip 20 (in this embodiment gallium arsenide based) which functions as a PROM or a PLA. Each of the memory cells 21 is connected to a metal word line 22, a metal bit line 23, and a metal power line 24. The memory cell 21 is an enhancement mode FET with the source connected to a bit line 23 by a laser programmable link 25 typically comprised of the same metal as the metal used for the word or bit lines. The gate of the FET is connected to a word line 22 and the drain of the FET to a power line 24.

As used in this description, metal lines such as gold are generally contemplated, but other types of highly conductive lines can be used and are, hence, included in the expression "metal lines." It also should be understood that as shown in FIG. 3, a compound semiconductor-based integrated circuit memory array made in accordance with this invention employs a plurality of memory cells together with peripheral circuits for accessing the data stored in memory. These circuits are described in copending applications: (1) Ser. No.

07/051,986 filed May 19, 1987, entitled "Capacitor Coupled Push Pull Logic Circuit," invented by Andrew C. Graham and Mark E. Fitzpatrick, and assigned to the Assignee of this invention; (2) Ser. No. 07/051,984 filed May 19, 1987, entitled "Field Effect Transistor Logic Circuit," invented by Mark E. Fitzpatrick and Andrew C. Graham, and assigned to the Assignee of this invention; (3) Ser. No. 07/052,660 filed May 19, 1987, entitled "TTL Compatible Input Buffer," invented by Andrew C. Graham and Mark E. Fitzpatrick, and assigned to the Assignee of this invention; (4) Ser. No. 07/051,983 filed May 19, 1987, entitled "TTL Compatible Output Buffer," invented by Andrew C. Graham and Mark E. Fitzpatrick, and assigned to the Assignee of this invention; (5) Ser. No. 07/052,099 filed May 19, 1987, entitled "Oscillator Circuit," invented by Mark E. Fitzpatrick and Andrew C. Graham, and assigned to the Assignee of this invention; and (6) U.S. Ser. No. 07/051,987 filed May 19, 1987, entitled "Integrated Circuit Implemented in Compound Semiconductor Technology," invented by David C. MacMillan and Andrew C. Graham, and assigned to the Assignee of this invention. However, the circuit in FIG. 3, unlike the prior art, does not require additional programming (write) circuitry connected to the word or bit lines. Hence, the circuit does not have additional loads which decrease its performance. Since the memory cell 21, word lines 22, and bit lines 23 do not have to withstand high programming voltage and current, layout and design of the circuit is configured for optimal performance and yield. Further, the laser programmable link has the same electrical characteristics as the line to which it is attached. Hence, unlike the prior art, the link adds no additional resistive loads to the circuit and special processing is not required to form the link.

Figure 4B:
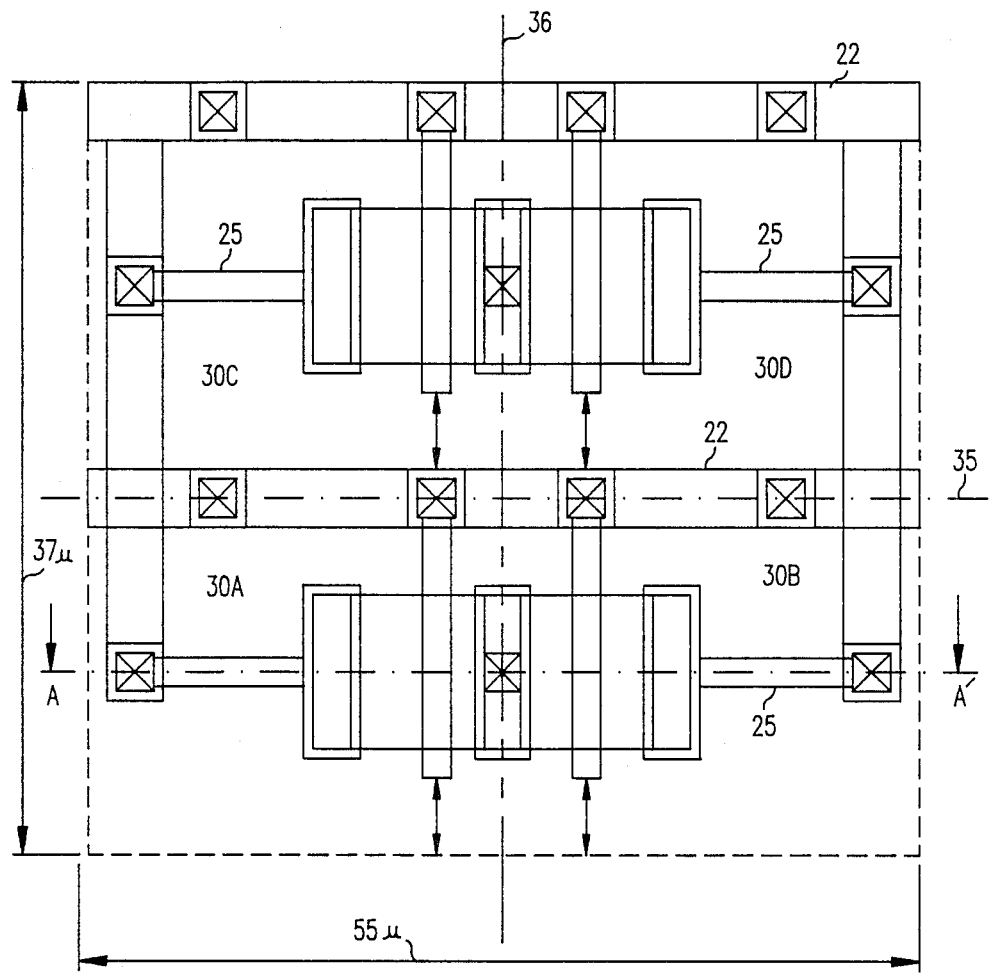
FIGS. 4a and 4b, illustrate the layout of the compound semiconductor-based programmable memory array.
Figure 4A:
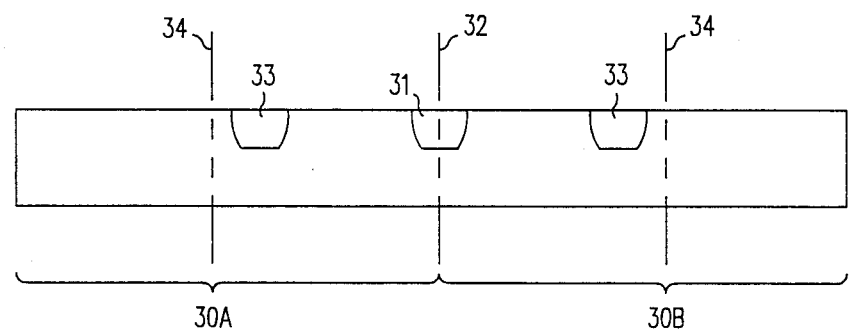

In FIG. 4a, two memory cells are shown in cross-section. The N-type drain and source regions are formed in a semi-insulating compound semiconductor substrate using standard technology. As used in this description, a compound semiconductor such as GaAs is generally contemplated, but other types of semiconductors may be used because the invention is not limited by the voltage and current characteristics of the semiconductor. The two cells 30a and 30b share a common drain region 31 which is located on one end of each memory cell and centered symmetrically about the center line 32 of the two cells 30a and 30b. The source region 33 for each memory cell is formed such that the source regions are symmetric with respect to the center line 32 of the two cells and located such that the edge of the source region most remote from the drain region 31 does not extend to the center line 34 of the individual memory cell.

In FIG. 4b, a top view of four memory cells 30a, 30b, 30c and 30d is shown. The semiconductor pockets comprising the source 33 and drain 31 regions exhibit mirror symmetry about the two center lines 35, 36 of the four memory cells.

After fabrication of the source and drain regions in the compound semiconductor chip, the metal word lines 22 are formed on the compound semiconductor chip in a first direction such that they are centered between, and parallel to the pockets comprising the field effect transistor. The laser programmable link 25 is connected to the center of the source region and extends parallel to the word lines to the edge of the memory cell that is most remote from the source region in the first direction. The bit lines 23 are formed such that they are orthogonal to the word lines 22 and centered over the edge of the memory cell to which the fuse extends and connecting the fuse. The metal gate lines are formed parallel to the bit lines and extend from the contact point with the memory cell's word line to beyond the drain and source region, but not to the next word line. Metal power lines 24 are formed parallel to the bit lines and centered over and contacting the drain regions of the FETs.

The relationship between the power, bit, and word lines and the symmetry of the memory cells optimizes the performance of the memory array and provides a maximum clear area around the fuse. This layout nearly minimizes the area associated with the FET and hence, further assists in leaving a clear area about the fuse. Since the laser programmable links are formed as a part of the metallization process for the word and bit lines, no special processing is required to form the links. The electrical characteristics of the programmable link are identical to the electrical characteristics of the word or bit lines.

The compound semiconductor-based array is programmed according to the customer's requirements by placing the chip on an ESI 8000B Laser Programming System. A computer, which has been programmed to compute the link positions to be blown, provides positioning information to a Q switched YAG laser. When the laser is properly aligned to the die, the link is blown with a laser pulse which has a wave length of 1.06 $\mu$m and a beam diameter of 6 microns. The memory cells have a first electrical state prior to programming the cell and an irreversible different second electrical state after programming.

Figure 5A:
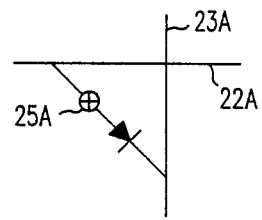
FIGS. 5a, 5b and 5c illustrate a diode memory cell of the novel compound semiconductor-based programmable memory array.
Figure 5B:
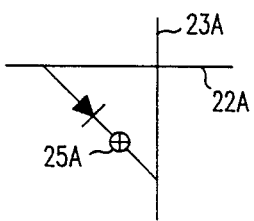
Figure 5C:
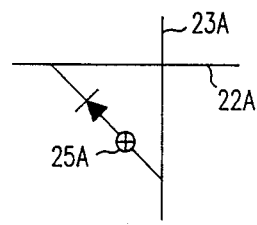

The memory cell 21 in FIG. 3 is comprised of an enhancement mode FET and a laser programmable link 25, but other embodiments wherein the memory cell comprises a depletion mode FET and a laser programmable fuse, a bipolar transistor and a laser programmable fuse, a combination of active components and a laser programmable fuse, or a diode and a laser programmable fuse, as shown in FIGS. 5a, 5b and 5c will also provide flexibility in circuit design and high-speed performance using the novel features of this invention. Further, the laser programmable array may also be implemented in silicon semiconductors. Implementation of laser programmable array in silicon semiconductors is not limited to the group of silicon semiconductors used in the prior art because the semiconductor does not need the capability to support the programming voltage and current. The performance of the silicon-based laser programmable array will be superior to that of a electrically programmable array because the laser programmable array has no programming circuitry to act as an additional load; the laser programmable array is designed for performance rather than the ability to withstand the programming voltage and current; and the size of the laser programmable array is not limited by the ability to reliably blow the fuses.

We claim:

1. A programmable semiconductor memory cell array comprising:
   a word line;
   first and second bit lines positioned orthogonal to said word line;
   first and second field effect transistors positioned between the bit lines, each having respective first and second drain/source regions;
   the second drain-source region of the first field effect transistor and the first drain/source region of the second field effect transistor being a common region;

a first laser programmable link connecting the first drain/source region of the first field effect transistor and the first bit line; and a second laser programmable link connecting the second drain/source region of the second field effect transistor and the second bit line.

2. The array of claim 1 wherein the first and second laser programmable links have longitudinal axes which are colinear.

3. The array of claim 1 wherein the first and second laser programmable links have longitudinal axes which are parallel to the word line.

4. The array of claim 1 wherein the first and second drain/source regions of the first and second field effect transistors are symmetrical about a line parallel to the word line.

5. The array of claim 4 wherein the first and second drain/source regions of the first and second field effect transistors are symmetrical about a line parallel to the first and second bit lines.

6. The array of claim 1 wherein the gates of the first and second field effect transistors are connected to the word line.

* * * * *